United States Patent
Son

(10) Patent No.: US 11,569,110 B2
(45) Date of Patent: Jan. 31, 2023

(54) BUFFER UNIT, AND APPARATUS AND METHOD FOR TREATING SUBSTRATE WITH THE UNIT

(71) Applicant: SEMES CO., LTD., Chungcheongnam-do (KR)

(72) Inventor: Dukhyun Son, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 676 days.

(21) Appl. No.: 16/540,859

(22) Filed: Aug. 14, 2019

(65) Prior Publication Data

US 2020/0066561 A1  Feb. 27, 2020

(30) Foreign Application Priority Data

Aug. 23, 2018 (KR) .................... 10-2018-0098589

(51) Int. Cl.
*H01L 21/673* (2006.01)
*H01L 21/67* (2006.01)
*H01L 21/02* (2006.01)

(52) U.S. Cl.
CPC ........ *H01L 21/67389* (2013.01); *H01L 21/02* (2013.01); *H01L 21/67017* (2013.01); *H01L 21/67028* (2013.01); *H01L 21/67242* (2013.01); *H01L 21/67383* (2013.01)

(58) Field of Classification Search
CPC .............. H01L 21/67389; H01L 21/02; H01L 21/67017; H01L 21/67028; H01L 21/67242; H01L 21/67383
See application file for complete search history.

(56) References Cited

U.S. PATENT DOCUMENTS

| 7,756,599 B2 * | 7/2010 | Kudo ................ H01L 21/67017 156/345.31 |
| 8,999,858 B2 * | 4/2015 | Koshi ............... H01L 21/02104 438/758 |
| 9,666,454 B2 * | 5/2017 | Choi ................. H01L 21/67017 |

(Continued)

FOREIGN PATENT DOCUMENTS

| CN | 104975270 A | * 10/2015 | ......... C23C 16/4412 |
| JP | H04199824 A | * 7/1992 | ........... H01L 21/302 |

(Continued)

OTHER PUBLICATIONS

Korean Patent Office, Office action dated Feb. 24, 2020.
Korean Patent Office, Notice of Allowance dated Aug. 6, 2020.

*Primary Examiner* — Nicolas A Arnett
(74) *Attorney, Agent, or Firm* — Li & Cai Intellectual Property (USA) Office

(57) ABSTRACT

A buffer unit for storing a substrate includes a housing having a buffer space inside, a substrate support unit that supports one or more substrates in the buffer space, a pressure adjustment unit that adjusts pressure in the buffer space, and a controller that controls the pressure adjustment unit. The pressure adjustment unit includes a gas supply line that supplies a gas for pressurizing the buffer space and a gas exhaust line that reduces the pressure in the buffer space. The controller controls the pressure adjustment unit to maintain the buffer space in a selected one of a filling mode in which the buffer space is filled with the gas and an exhaust mode in which the buffer space is evacuated.

7 Claims, 9 Drawing Sheets

(56) References Cited

U.S. PATENT DOCUMENTS

| | | | | |
|---|---|---|---|---|
| 10,332,766 | B2* | 6/2019 | Sasaki | H01L 21/67757 |
| 10,590,531 | B1* | 3/2020 | Shirako | C23C 16/54 |
| 11,286,563 | B2* | 3/2022 | Komori | H01L 21/67161 |
| 2004/0159573 | A1* | 8/2004 | Lim | H01L 21/67769 |
| | | | | 206/524.4 |
| 2007/0292974 | A1* | 12/2007 | Mizuno | C23C 16/50 |
| | | | | 118/699 |
| 2013/0164943 | A1* | 6/2013 | Koshi | C23C 16/24 |
| | | | | 118/712 |
| 2016/0372347 | A1* | 12/2016 | Kim | F16K 1/44 |
| 2019/0096738 | A1* | 3/2019 | Okajima | H01L 21/67109 |
| 2020/0066561 | A1* | 2/2020 | Son | H01L 21/67389 |
| 2020/0066562 | A1* | 2/2020 | Son | H01L 21/6732 |
| 2020/0083078 | A1* | 3/2020 | Kinoshita | H01L 21/67109 |
| 2020/0381268 | A1* | 12/2020 | Okuno | B08B 5/00 |
| 2021/0235583 | A1* | 7/2021 | Yang | H01L 21/67389 |

FOREIGN PATENT DOCUMENTS

| | | |
|---|---|---|
| KR | 1020130106543 A | 9/2013 |
| KR | 10-1682473 B | 11/2016 |
| KR | 10-1688620 B | 12/2016 |
| KR | 10-1758213 B | 7/2017 |
| KR | 1020180046272 A | 5/2018 |
| KR | 10-1874809 B | 6/2018 |

\* cited by examiner

BUFFER UNIT, AND APPARATUS AND METHOD FOR TREATING SUBSTRATE WITH THE UNIT

CROSS-REFERENCE TO RELATED APPLICATIONS

A claim for priority under 35 U.S.C. § 119 is made to Korean Patent Application No. 10-2018-0098589 filed on Aug. 23, 2018, in the Korean Intellectual Property Office, the entire contents of which are hereby incorporated by reference.

BACKGROUND

Embodiments of the inventive concept described herein relate to an apparatus for treating a substrate, and more particularly, relate to an apparatus for storing a substrate.

To manufacture semiconductor devices, various processes such as a photolithography process, an etching process, an ashing process, an ion implantation process, a thin-film deposition process, and the like are performed to form a pattern on a substrate. Among these processes, the etching process, the ion implantation process, and the thin-film deposition process treat the substrate in a vacuum atmosphere. When the substrate moved from the vacuum atmosphere to the atmospheric atmosphere is exposed to oxygen, particles and fumes are formed on the substrate. Therefore, after the substrate treating processes, a process of removing the particles and the fumes is performed while the substrate is stored in a buffer unit.

A process of adjusting the pressure in the space in which the substrate is stored is performed to remove the particles and the fumes in the buffer unit. The pressure adjustment process has a positive pressure mode in which the pressure in the storage space is adjusted to a positive pressure and a negative pressure mode in which the pressure in the storage space is adjusted to a negative pressure. For example, in the positive pressure mode, the foreign matter remaining on the substrate is blown and removed by filling the storage space with gas. In contrast, in the negative pressure mode, the foreign matter remaining on the substrate is discharged and removed by reducing the pressure in the storage space.

FIG. 1 is a view illustrating buffer units in the related art. Referring to FIG. 1, the buffer units include various types of units such as a first unit 2, a second unit 4, and a third unit 6. The first unit 2 has a gas supply line 2a, and the gas supply line 2a supplies a gas into the first unit 2 to perform a positive pressure mode. The second unit 4 has a gas exhaust line 4a, and the gas exhaust line 4a reduces the pressure in the second unit 4 to perform a negative pressure mode. The third unit 6 has a gas supply line 6a and a gas exhaust line 6b and performs the supply and release of a gas together to form a gas flow in the third unit 6.

However, the first unit 2 and the second unit 4 can perform only one of the positive pressure mode and the negative pressure mode and cannot perform the other mode. Furthermore, the third unit 6 requires more devices than the first unit 2 and the second unit 4 and needs a large space for the devices.

SUMMARY

Embodiments of the inventive concept provide an apparatus for cleaning a substrate by adjusting the pressure in a storage space in various ways while the substrate is stored.

Embodiments of the inventive concept provide an apparatus for switching a buffer unit to various pressure modes without a space limitation of equipment.

According to an exemplary embodiment, an apparatus for storing a substrate is provided.

A buffer unit for storing a substrate includes a housing having a buffer space inside, a substrate support unit that supports one or more substrates in the buffer space, a pressure adjustment unit that adjusts pressure in the buffer space, and a controller that controls the pressure adjustment unit. The pressure adjustment unit includes a gas supply line that supplies a gas for pressurizing the buffer space and a gas exhaust line that reduces the pressure in the buffer space. The controller controls the pressure adjustment unit to maintain the buffer space in a selected one of a filling mode in which the buffer space is filled with the gas and an exhaust mode in which the buffer space is evacuated.

The pressure adjustment unit may further include a main line, a gas supply unit that supplies the gas into the main line, and a pressure-reducing member that reduces pressure in the main line. The gas supply line and the gas exhaust line may be connected with the main line through a three-way valve.

The controller may control the three-way valve to open the gas supply line and block the gas exhaust line in the filling mode and to block the gas supply line and open the gas exhaust line in the exhaust mode.

The controller may control the pressure adjustment unit to maintain the buffer space in a selected one of the filling mode and the exhaust mode according to a gas that is used to treat the substrates before the substrates are stored in the buffer space.

The controller may control the pressure adjustment unit to maintain the buffer space in the exhaust mode when the gas includes fluorine (F), chlorine (CO, or bromine (Br) and to maintain the buffer space in the filling mode when the gas includes ammonia ($NH_3$).

According to an exemplary embodiment, an apparatus for treating a substrate includes a process module that treats the substrate and an index module located on one side of the process module. The index module includes a load port on which a carrier having the substrate received therein is placed, a transfer frame disposed between the load port and the process module, and a buffer unit that is disposed on one side of the transfer frame and that temporarily stores the substrate treated in the process module. The buffer unit includes a housing having a buffer space inside, a substrate support unit that supports one or more substrates in the buffer space, a pressure adjustment unit that adjusts pressure in the buffer space, and a controller that controls the pressure adjustment unit. The pressure adjustment unit includes a gas supply line that supplies a gas for pressurizing the buffer space and a gas exhaust line that reduces the pressure in the buffer space. The controller controls the pressure adjustment unit to maintain the buffer space in a selected one of a filling mode in which the buffer space is filled with the gas and an exhaust mode in which the buffer space is evacuated.

The process module may include a first process unit that performs a first process and a second process unit that performs a second process independently of the first process unit. The controller may maintain the buffer space in the exhaust mode for a substrate on which the first process is performed and may maintain the buffer space in the filling mode for a substrate on which the second process is performed. A gas used in the first process may include fluorine (F), chlorine (CO, or bromine (Br), and a gas used in the second process may include ammonia ($NH_3$).

The pressure adjustment unit may further include a main line, a gas supply unit that supplies the gas into the main line, and a pressure-reducing member that reduces pressure in the main line. The gas supply line and the gas exhaust line may be connected with the main line through a three-way valve. The controller may control the three-way valve to open the gas supply line and block the gas exhaust line in the filling mode and to block the gas supply line and open the gas exhaust line in the exhaust mode.

According to an exemplary embodiment, a method for treating a substrate includes a substrate treating step of treating the substrate and a substrate storing step of storing the substrate in a buffer unit after the substrate treating step. An inner space of the buffer unit is maintained in a selected one of a filling mode in which the inner space is filled with a gas and an exhaust mode in which the inner space is evacuated.

One of a first process of treating the substrate with a first gas and a second process of treating the substrate with a second gas may be performed in the substrate treating step. The first gas and the second gas may be different types of gases. The selected mode may be varied depending on the type of gas used in the substrate treating step.

The exhaust mode may be maintained when the first process is performed, and the filling mode may be maintained when the second process is performed. The first gas may include fluorine (F), chlorine (CO, or bromine (Br), and the second gas may include ammonia ($NH_3$).

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
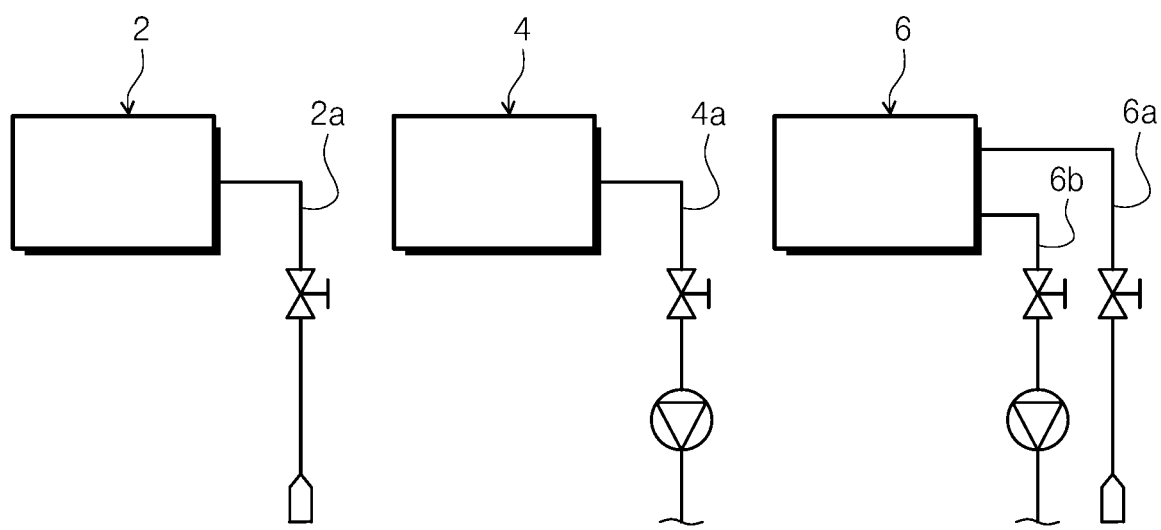
FIG. 1 is a view illustrating buffer units in the related art.

Various modifications and variations can be made to embodiments of the inventive concept, and the scope of the inventive concept should not be constructed as limited to the embodiments set forth herein. These embodiments are provided so that this disclosure will be thorough and complete, and will fully convey the scope of the inventive concept to those skilled in the art. Accordingly, in the drawings, the shapes of components are exaggerated for clarity of illustration.

In the embodiments of the inventive concept, a substrate treating apparatus for etching a substrate using plasma will be described. However, without being limited thereto, the inventive concept is applicable to various types of apparatuses for treating a substrate using gas.

Figure 2:
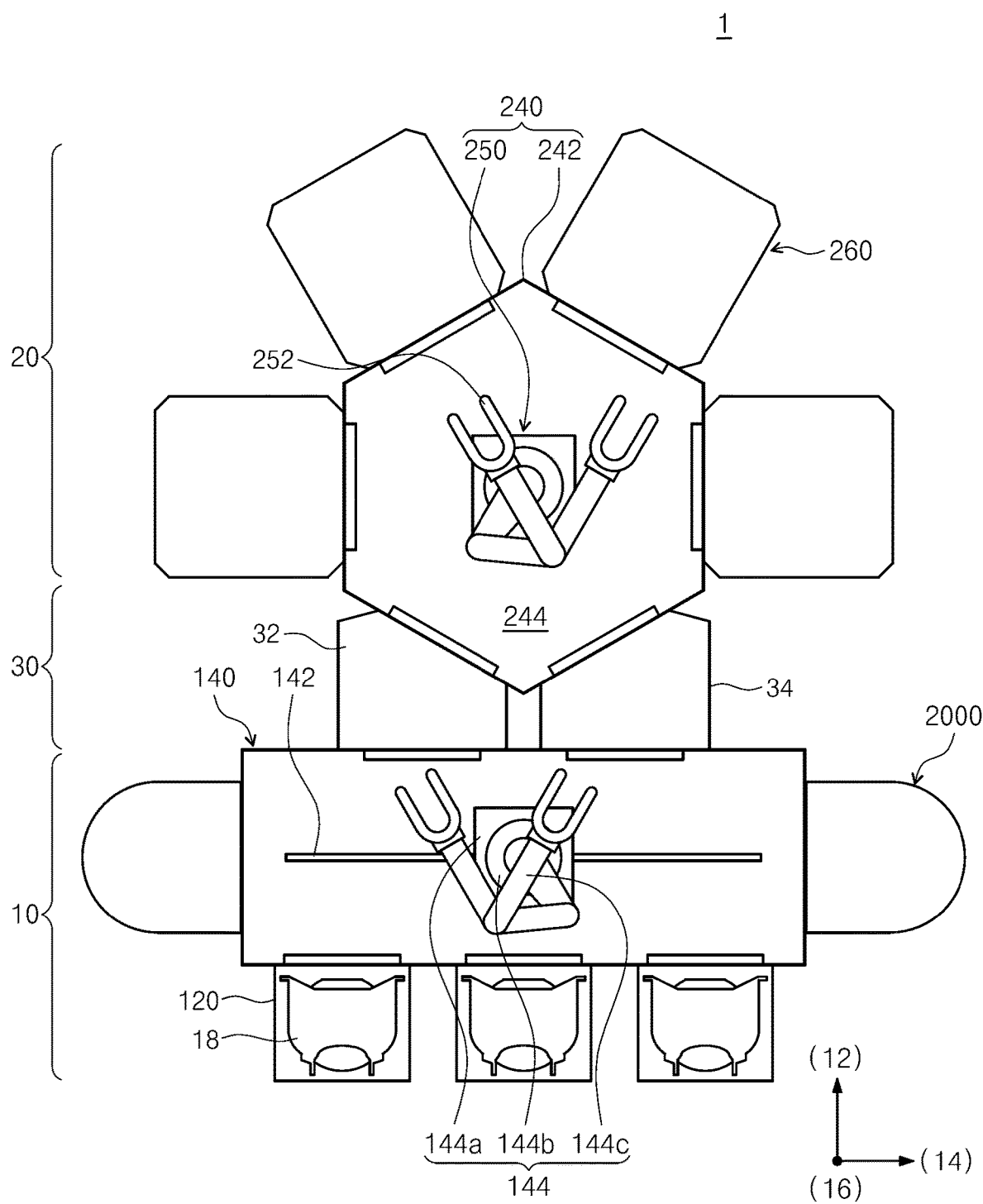
FIG. 2 is a schematic plan view illustrating substrate treating apparatus according to an embodiment of the inventive concept.

FIG. 2 is a schematic plan view illustrating substrate treating apparatus according to an embodiment of the inventive concept.

Referring to FIG. 2, the substrate treating apparatus 1 has an index module 10, a loading module 30, and a process module 20. The index module 10 has a load port 120, a transfer frame 140, and a buffer unit 2000. The load port 120, the transfer frame 140, and the process module 20 are sequentially arranged in a row. Hereinafter, the direction in which the load port 120, the transfer frame 140, the loading module 30, and the process module 20 are arranged is referred to as a first direction 12, a direction perpendicular to the first direction 12 when viewed from above is referred to as a second direction 14, and a direction perpendicular to the plane including the first direction 12 and the second direction 14 is referred to as a third direction 16.

A carrier 18 having a plurality of substrates W received therein is placed on the load port 120. A plurality of load ports 120 may be provided. The plurality of load ports 120 may be arranged in a row along the second direction 14. FIG. 2 illustrates one example that the index module 10 has three load ports 120. However, the number of load ports 120 may be increased or decreased depending on conditions such as the process efficiency and footprint of the process module 20. The carrier 18 has a plurality of slots (not illustrated) that are formed therein to support the edges of the substrates W. The plurality of slots are arranged along the third direction 16, and the substrates W are stacked one above another with a spacing gap therebetween in the carrier 18 along the third direction 16. A Front Opening Unified Pod (FOUP) may be used as the carrier 18.

The transfer frame 140 transfers the substrates W between the carriers 18 placed on the load ports 120, the buffer unit 2000, and the loading module 30. An index rail 142 and an index robot 144 are provided in the transfer frame 140. The index rail 142 is arranged such that the lengthwise direction thereof is parallel to the second direction 14. The index robot 144 is mounted on the index rail 142 and linearly moves along the index rail 142 in the second direction 14. The index robot 144 includes a base 144a, a body 144b, and an index arm 144c. The base 144a is installed to be movable along the index rail 142. The body 144b is combined with the base 144a. The body 144b is movable on the base 144a along the third direction 16. Furthermore, the body 144b is rotatable on the base 144a. The index arm 144c is combined with the body 144b and is movable forward and backward relative to the body 144b. A plurality of index arms 144c may be provided. The index arms 144c may individually operate. The index arms 144c may be stacked one above another with a spacing gap therebetween along the third direction 16. Some of the index arms 144c may be used to transfer the substrates W from the process module 20 to the carriers 18, and the other index arms 144c may be used to transfer the substrates W from the carriers 18 to the process module 20. Accordingly, particles generated from substrates W to be treated may be prevented from adhering to treated substrates W in the process in which the index robot 144 transfers the substrates W.

The buffer unit 2000 temporarily stores the substrates W treated in the process module 20. The buffer unit 2000 removes process by-products remaining on the substrates W. The removal of the process by-products in the buffer unit 2000 may be performed by raising or lowering the pressure in the buffer unit 2000. A plurality of buffer units 2000 may be provided. For example, two buffer units 2000 may be provided. The two buffer units 2000 may be provided on opposite sides of the transfer frame 140 and may be located to face each other with the transfer frame 140 therebetween. Alternatively, only one buffer unit 2000 may be provided on one side of the transfer frame 140.

The loading module 30 is disposed between the transfer frame 140 and a transfer chamber 242. The loading module 30 provides a space in which the substrates W stay before transferred between the transfer chamber 242 and the transfer frame 140. The loading module 30 includes a load-lock chamber 32 and an unload-lock chamber 34. The load-lock chamber 32 and the unload-lock chamber 34 are provided such that the inner spaces thereof can be switched between a vacuum atmosphere and an atmospheric atmosphere.

The load-lock chamber 32 provides a space in which a substrate W to be transferred from the index module 10 to the process module 20 temporarily stays. When the substrate W is placed in the load-lock chamber 32, the inner space of the load-lock chamber 32 is sealed from the index module 10 and the process module 20. Thereafter, the inner space of the load-lock chamber 32 is switched from the atmospheric atmosphere to the vacuum atmosphere, and the load-lock chamber 32 is open to the process module 20 in the state of being sealed from the index module 10.

The unload-lock chamber 34 provides a space in which a substrate W to be transferred from the process module 20 to the index module 10 temporarily stays. When the substrate W is placed in the unload-lock chamber 34, the inner space of the unload-lock chamber 34 is sealed from the index module 10 and the process module 20. Thereafter, the inner space of the unload-lock chamber 34 is switched from the vacuum atmosphere to the atmospheric atmosphere, and the unload-lock chamber 34 is open to the index module 10 in the state of being sealed from the process module 20.

The process module 20 includes the transfer chamber 242 and a plurality of process units 260.

The transfer chamber 242 transfers a substrate W between the load-lock chamber 32, the unload-lock chamber 34, and the plurality of process units 260. The transfer chamber 242 may have a hexagonal shape when viewed from above. Alternatively, the transfer chamber 242 may have a rectangular or pentagonal shape. The load-lock chamber 32, the unload-lock chamber 34, and the plurality of process units 260 are located around the transfer chamber 242. A transfer robot 250 is provided in the transfer chamber 242. The transfer robot 250 may be located at the center of the transfer chamber 242. The transfer robot 250 may have a plurality of hands 252 that are movable in the horizontal and vertical directions and movable forward or backward or rotatable on the horizontal plane. Each of the hands 252 is operable independently, and substrates W may be horizontally placed on the hands 252.

A substrate treating apparatus 1000 provided in each of the process units 260 will be described below. The substrate treating apparatus 1000 performs an etching or deposition process on a substrate W. According to an embodiment, the substrate treating apparatuses 1000 may perform different substrate treating processes, respectively. A first apparatus may perform a first process of supplying a first gas, and a second apparatus may perform a second process of supplying a second gas. The first gas may include fluorine (F), chlorine (CO, or bromine (Br), and the second gas may include ammonia ($NH_3$).

Figure 3:
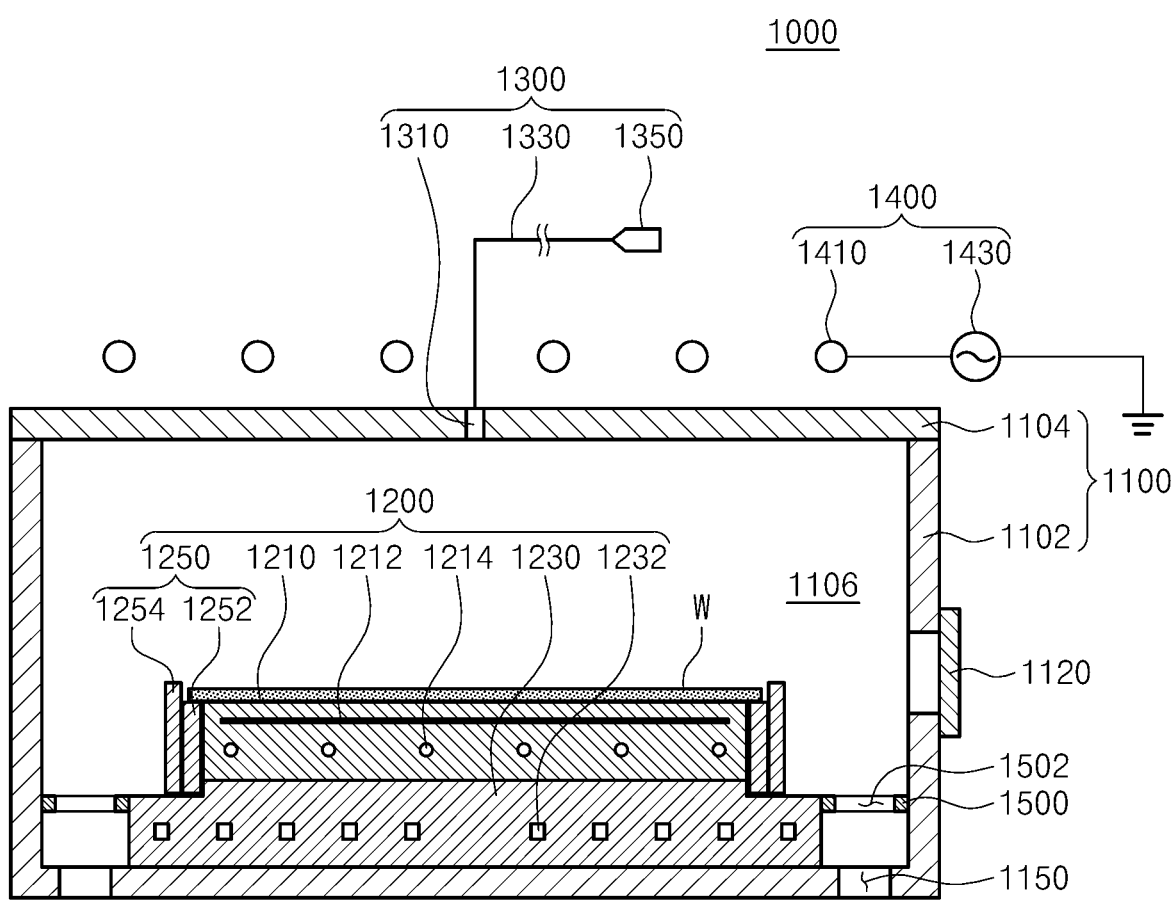
FIG. 3 is a sectional view illustrating a gas treating apparatus of FIG. 2.

FIG. 3 is a sectional view illustrating the gas treating apparatus of FIG. 2. Referring to FIG. 3, the gas treating apparatus 1000 includes a chamber 1100, a substrate support unit 1200, a gas supply unit 1300, a plasma source 1400, and an exhaust baffle 1500.

The chamber 1100 has a processing space 1106 in which a substrate W is treated. The chamber 1100 has a cylindrical shape. The chamber 1100 is formed of metal. For example, the chamber 1100 may be formed of aluminum. The chamber 1100 has an opening formed in a sidewall 1102 thereof. The opening functions as an entrance through which the substrate W is placed in or extracted from the chamber 1100. The opening is opened or closed by a door 1120. The chamber 1100 has a lower hole 1150 formed in the bottom thereof. A pressure-reducing member (not illustrated) is connected to the lower hole 1150. The processing space 1106 of the chamber 1100 may be evacuated by the pressure-reducing member and may be maintained in an atmosphere of reduced pressure during a process.

The substrate support unit 1200 supports the substrate W in the processing space 1106. The substrate support unit 1200 may be an electrostatic chuck 1200 that supports the substrate W using an electrostatic force. Alternatively, the substrate support unit 1200 may support the substrate W in various manners such as mechanical clamping.

The electrostatic chuck 1200 includes a dielectric plate 1210, a base 1230, and a focus ring 1250. The dielectric plate 1210 may be formed of a dielectric substance. The substrate W is directly placed on an upper surface of the dielectric plate 1210. The dielectric plate 1210 has a circular plate shape. The dielectric plate 1210 may have a smaller radius than the substrate W. An electrode 1212 for chucking is installed in the dielectric plate 1210. A power supply (not illustrated) is connected to the electrode 1212 for chucking. Power is applied from the power supply (not illustrated) to the electrode 1212 for chucking, and the substrate W is clamped to the dielectric plate 1210 by an electrostatic force. A heater 1214 for heating the substrate W is installed in the dielectric plate 1210. The heater 1214 is located under the electrode 1212 for chucking. The heater 1214 may be implemented with a coil in a spiral shape.

The base 1230 supports the dielectric plate 1210. The base 1230 is located under the dielectric plate 1210 and is fixedly combined with the dielectric plate 1210. An upper surface of the base 1230 has a stepped shape such that the central region is located in a higher position than the edge region. The central region of the upper surface of the base 1230 has an area corresponding to that of a bottom surface of the dielectric plate 1210. A cooling fluid channel 1232 is formed in the base 1230. The cooling fluid channel 232 serves as a passage through which a cooling fluid circulates. The cooling fluid channel 1232 may be provided in a spiral shape in the base 1230. The base 1230 is connected with an RF power supply 1234 located outside. The RF power supply 1234 applies power to the base 1230. The power applied to the base 1230 guides plasma generated in the chamber 1100 toward the base 1230. The base 1230 may be formed of metal.

The focus ring 1250 concentrates the plasma on the substrate W. The focus ring 1250 includes an inner ring 1252 and an outer ring 1254. The inner ring 1252 has an annular ring shape that surrounds the dielectric plate 1210. The inner ring 1252 is located on the edge region of the base 1230. The inner ring 1252 has an upper surface at the same height as the upper surface of the dielectric plate 1210. An inner portion of the upper surface of the inner ring 1252 supports the edge region of the backside of the substrate W. For example, the inner ring 1252 may be formed of a conductive material. The outer ring 1254 has an annular ring shape that surrounds the inner ring 1252. The outer ring 1254 is located adjacent to the inner ring 1252 on the edge region of the base 1230. The outer ring 1254 has an upper end higher than that of the inner ring 1252. The outer ring 1254 may be formed of an insulating material.

The gas supply unit 1300 supplies a process gas onto the substrate W supported on the substrate support unit 1200. The gas supply unit 1300 includes a gas reservoir 1350, a gas supply line 1330, and a gas intake port 1310. The gas supply line 1330 connects the gas reservoir 1350 and the gas intake port 1310. The process gas stored in the gas reservoir 1350 is supplied to the gas intake port 1310 through the gas supply line 1330. The gas intake port 1310 is installed in an upper wall 1104 of the chamber 1100. The gas intake port 1310 is located opposite the substrate support unit 1200. According to an embodiment, the gas intake port 1310 may be installed in the center of the upper wall 1104 of the chamber 1100. A valve may be installed in the gas supply line 1330 to open or close the inner passage of the gas supply line 1330 or to adjust the flow rate of gas flowing through the inner passage of the gas supply line 1330. For example, the process gas may be an etching gas.

The plasma source 1400 excites the process gas in the chamber 1100 into a plasma state. An Inductively Coupled Plasma (ICP) source may be used as the plasma source 1400. The plasma source 1400 includes an antenna 1410 and an external power supply 1430. The antenna 1410 is disposed over the chamber 1100. The antenna 1410 is provided in a spiral shape wound a plurality of times and is connected with the external power supply 1430. The antenna 1410 receives power from the external power supply 1430. The antenna 1410 to which the power is applied forms a discharge space in the inner space of the chamber 1100. The process gas staying in the discharge space may be excited into a plasma state.

The exhaust baffle 1500 uniformly releases the plasma from the processing space 1106 by region. The exhaust baffle 1500 has an annular ring shape. In the processing space 1106, the exhaust baffle 1500 is located between an inner wall of the chamber 1100 and the substrate support unit 1200. The exhaust baffle 1500 has a plurality of exhaust holes 1502 formed therein. The exhaust holes 1502 are directed in the vertical direction. The exhaust holes 1502 extend from an upper end of the exhaust baffle 1500 to a lower end thereof. The exhaust holes 1502 are spaced apart from each other along the circumferential direction of the exhaust baffle 1500. Each of the exhaust holes 1502 has a slit shape and has a lengthwise direction directed in the radial direction.

Figure 4:
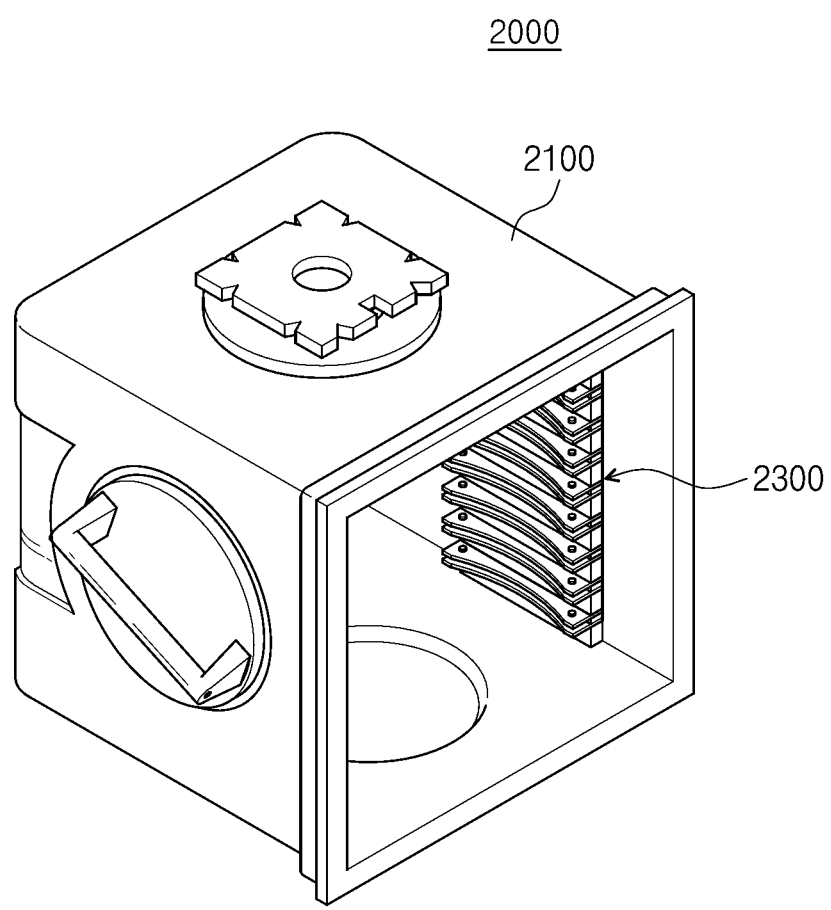
FIG. 4 is a perspective view illustrating a buffer unit of FIG. 2.
Figure 5:
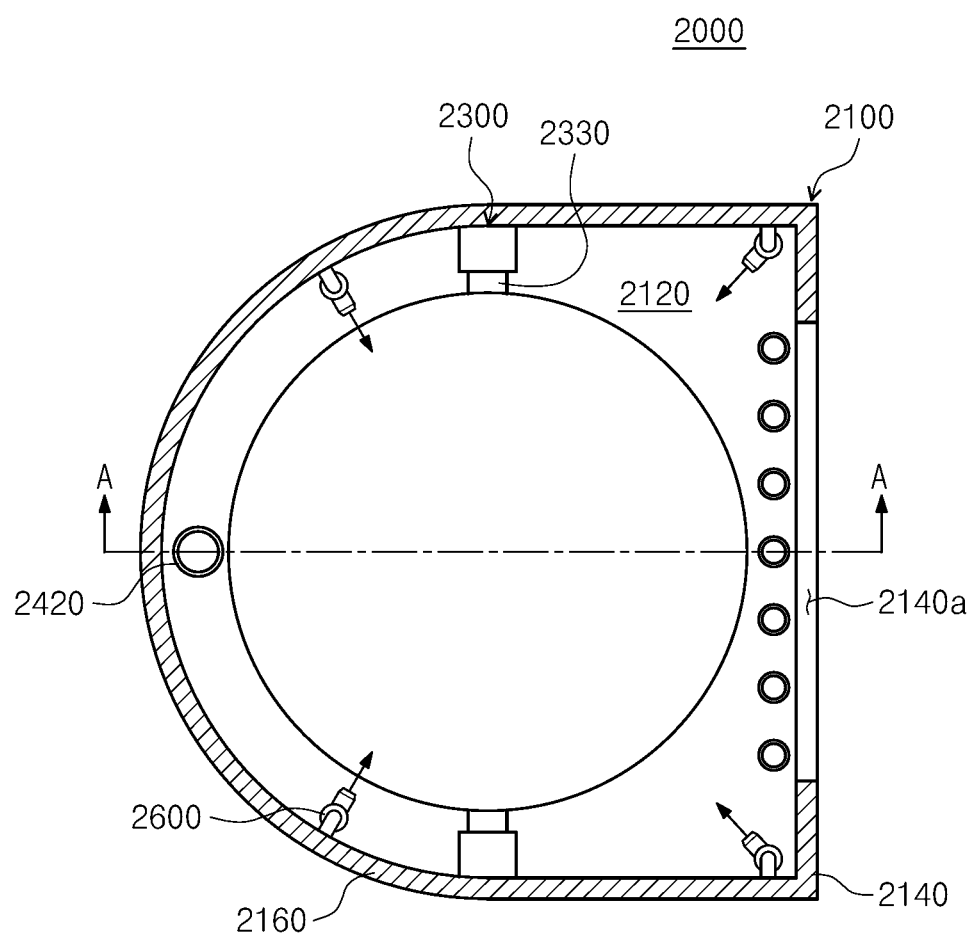
FIG. 5 is a plan view illustrating the buffer unit of FIG. 4.
Figure 6:
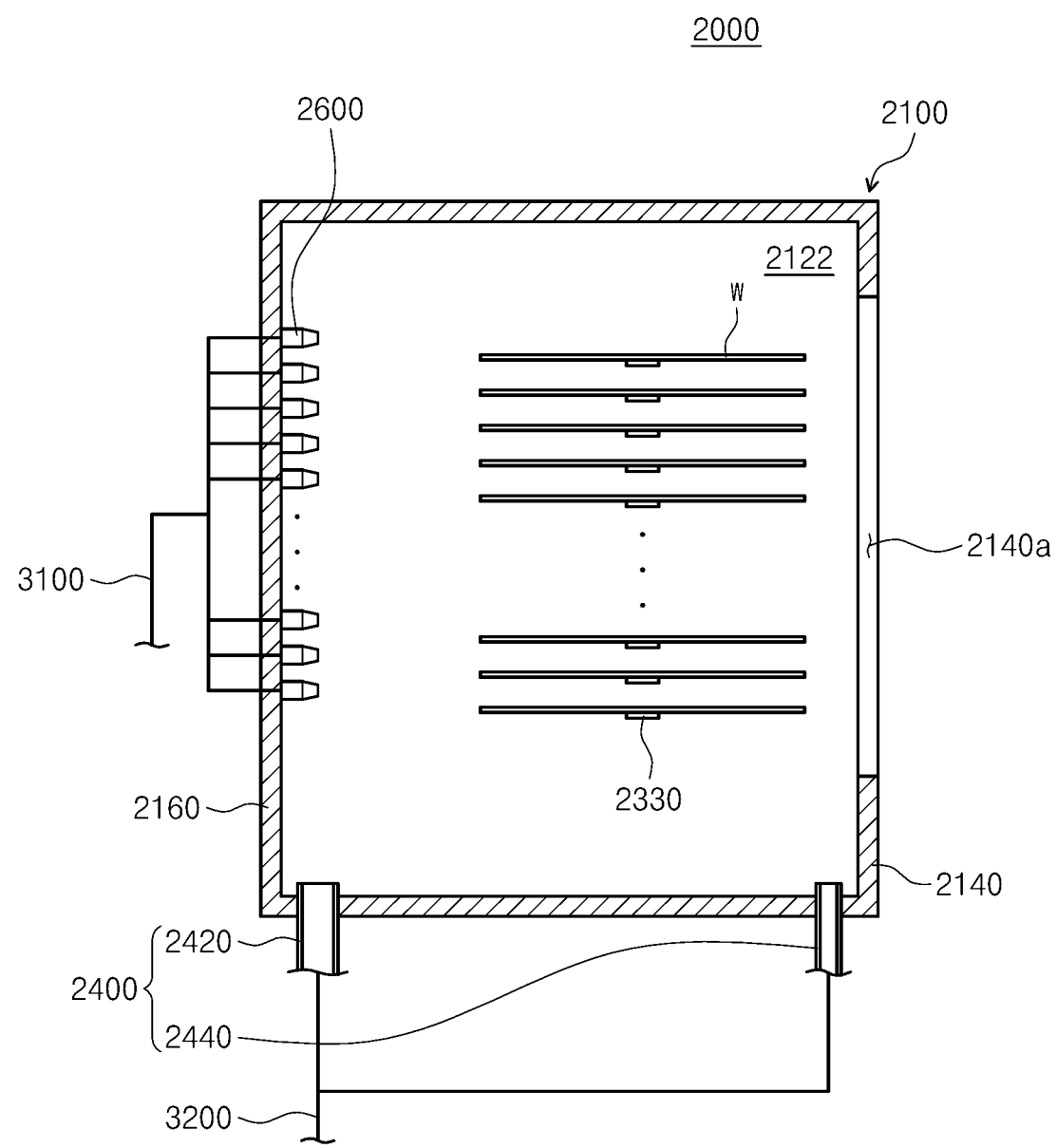
FIG. 6 is a sectional view taken along line A-A of FIG. 5.

Hereinafter, the aforementioned buffer unit will be described in more detail. FIG. 4 is a perspective view illustrating the buffer unit of FIG. 2. FIG. 5 is a plan view illustrating the buffer unit of FIG. 4. FIG. 6 is a sectional view taken along line A-A of FIG. 5. Referring to FIGS. 4 to 6, the buffer unit 2000 includes a housing 2100, a substrate support unit 2300, an exhaust port 2400, a gas nozzle 2600, a pressure adjustment unit 3000 (refer to FIG. 7), and a controller 3600 (refer to FIG. 7).

The housing 2100 has a container shape with a buffer space 2120 inside. The housing 2100 has a lengthwise direction directed in the third direction 16. The buffer space 2120 is provided as a space in which a plurality of substrates can be received. The housing 2100 has an open face 2140. The open face 2140 is opposite the transfer frame 140. The open face 2140 functions as an entrance 2140a through which the substrates W are transferred between the transfer frame 140 and the buffer space 2120.

The substrate support unit 2300 supports a substrate W in the buffer space 2120. The substrate support unit 2300 supports a plurality of substrates W. The plurality of substrates W are arranged in the vertical direction by the substrate support unit 2300. The substrate support unit 2300 includes a plurality of support slots 2330. The support slots 2330 have seating surfaces on which the substrates W are seated, respectively. Here, the seating surfaces may be upper surfaces of the support slots 2330. The support slots 2330 protrude from an inner surface of the housing 2100. Two support slots 2330 located at the same height are located to face each other when viewed from above. Furthermore, the support slots 2330 are spaced apart from each other along the third direction 16. The gap between the support slots 2330 adjacent to each other in the third direction 16 may be the same. Accordingly, the plurality of substrates W may be supported on the substrate support unit 230 in the state of being stacked one above another. Alternatively, when viewed from above, three or more support slots 2330 may be provided at the same height.

The exhaust port 2400 functions as a passage through which the atmosphere in the buffer space 2120 is evacuated. Particles and fumes removed from the substrates W are discharged through the exhaust port 2400. The exhaust port 2400 includes a front port 2420 and a rear port 2440. The front port 2420 and the rear port 2440 serve as holes through which the atmosphere in the buffer space 2120 is evacuated. The front port 2420 is located closer to the open face 2140 of the housing 2100 than the rear port 2440 when viewed from above. For example, when viewed from above, the front port 2420 may be located on one side of the substrates W supported on the support slots 2330, and the rear port 2440 may be located on an opposite side of the substrates W. The front port 2420 and the rear port 2440 are installed in the bottom of the housing 2100. The front port 2420 has a plurality of front holes. The front holes are arranged along the first direction 12. The rear port 2440 has a larger diameter than the front holes. Alternatively, the front port 2420 and the rear port 2440 may be installed in the ceiling of the housing 2100.

The gas nozzle 2600 dispenses a gas into the buffer space 2120. A plurality of gas nozzles 2600 may be provided. The gas nozzles 2600 may be installed on an inner wall of the housing 2100. The gas nozzles 2600 may be spaced apart from each other in the vertical direction and in the circumferential direction of the housing 2100. The gas nozzles 2600 are divided into a plurality of groups, each having gas nozzles arranged on the same vertical line. In this embodiment, it will be exemplified that the gas nozzles 2600 are divided into four groups, each of which has gas nozzles arranged on the same vertical line. However, the number of groups, each having gas nozzles arranged in the same vertical column, may be three or fewer, or five or more. The gas nozzles 2600 have discharge openings facing the substrates W supported on the support slots 2330, respectively. For example, the gap between the gas nozzles 2600 adjacent to each other in the vertical direction may be the same as the vertical gap between the support slots 2330.

Figure 7:
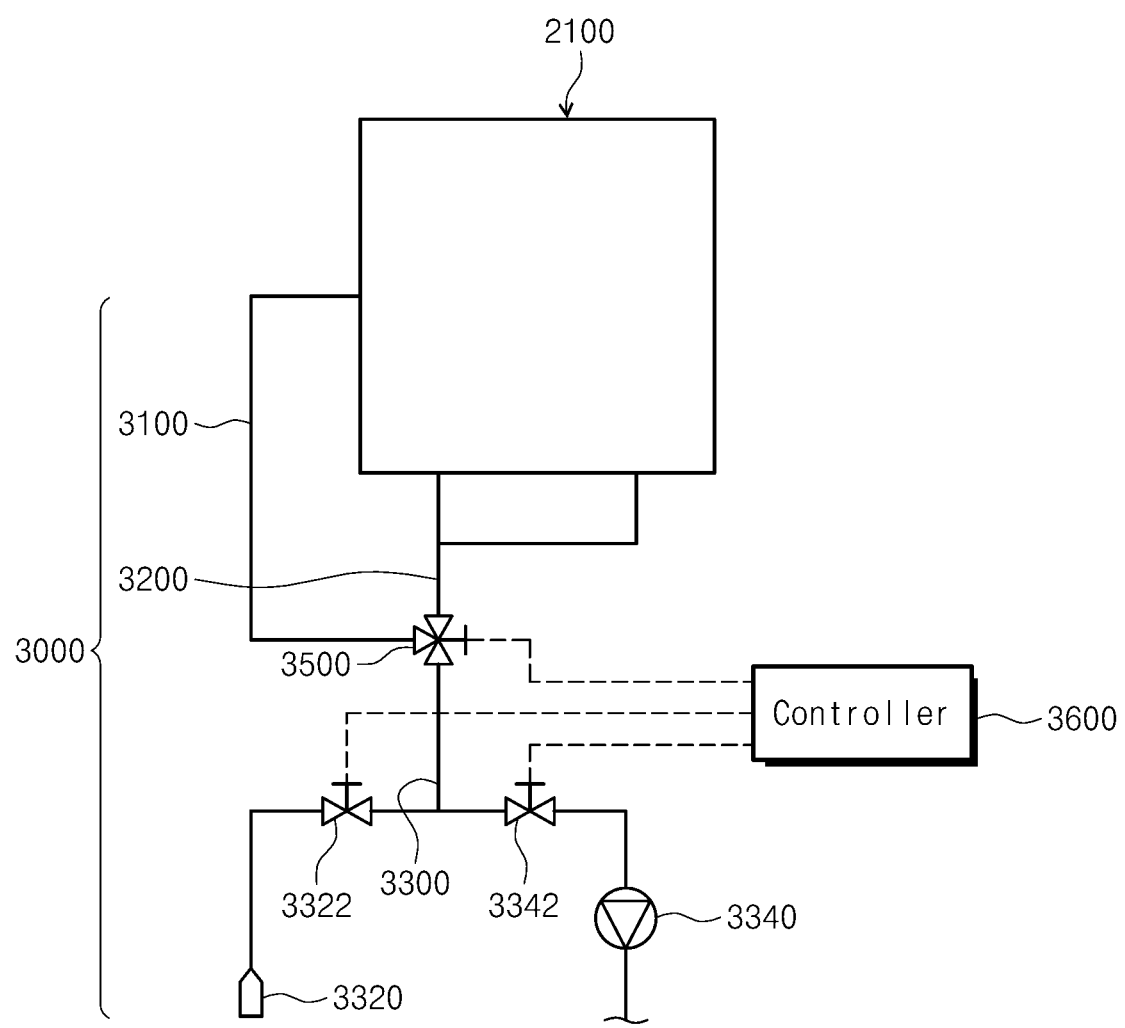
FIG. 7 is a view illustrating a pressure adjustment unit of FIG. 4.

Referring to FIG. 7, the pressure adjustment unit 3000 adjusts the pressure in the buffer space 2120. The pressure adjustment unit 3000 adjusts the pressure in the buffer space 2120 to a positive pressure higher than the atmospheric pressure or a negative pressure lower than the atmospheric pressure. The pressure adjustment unit 3000 includes a gas supply line 3100, a gas exhaust line 3200, a main line 3300, a three-way valve 3500, a gas supply unit 3320, and a pressure-reducing member 3340.

The gas supply line 3100 supplies a gas to pressurize the buffer space 2120. The gas supply line 3100 is connected to the gas nozzles 2600 and supplies the gas to the gas nozzles 2600. For example, the gas may be an inert gas or air.

The gas exhaust line 3200 delivers a negative pressure to reduce the pressure in the buffer space 2120. The gas exhaust line 3200 is connected to the front port 2420 and the rear port 2440. Accordingly, the buffer space 2120 is evacuated through the front port 2420 and the rear port 2440.

The main line 3300 is connected to the gas supply line 3100 and the gas exhaust line 3200. The main line 3300, the gas supply line 3100, and the gas exhaust line 3200 are connected together by the three-way valve 3500. That is, the three-way valve 3500 is installed at the point where the main line 3300, the gas supply line 3100, and the gas exhaust line 3200 are connected together. The three-way valve 3500 opens one of the gas supply line 3100 and the gas exhaust line 3200 and blocks the other. Accordingly, the main line 3300 is connected to one of the gas supply line 3100 and the gas exhaust line 3200.

The gas supply unit 3320 and the pressure-reducing member 3340 are connected to the main line 3300. The gas supply unit 3320 supplies the gas into the main line 3300, and the pressure-reducing member 3340 reduces the pressure in the main line 3300. A first valve 3322 and a second valve 3342 are installed in the main line 3300. The first valve 3322 allows or stops the supply of the gas from the gas supply unit 3320 to the main line 3300, and the second valve 3342 allows or stops the delivery of the negative pressure from the pressure-reducing member 3340 to the main line 3300. That is, when one of the first valve 3322 and the second valve 3342 is open, the other is closed. Accordingly, only one of the supply of the gas into the main line 3300 and the delivery of the negative pressure to the main line 3300 is performed.

The controller 3600 controls the pressure adjustment unit 3000 to maintain the buffer space 2120 in a selected one of a filling mode and an exhaust mode. Here, the filling mode is a mode in which the gas is supplied into the buffer space 2120 to pressurize the buffer space 2120, and the exhaust mode is a mode in which the buffer space 2120 is evacuated. The controller 3600 controls the first valve 3322, the second valve 3342, and the three-way valve 3500 to maintain only one of the filling mode and the exhaust mode. The filling mode and the exhaust mode may be differently selected according to the type of gas that is used to treat the substrates W before the substrates W are stored in the buffer space 2120. According to an embodiment, the filling mode may be maintained for the substrates W on which the first process is performed, and the exhaust mode may be maintained for the substrates W on which the second process is performed.

Hereinafter, a method of treating a substrate W using the above-described substrate treating apparatus will be described. A first substrate $W_1$ received in the carrier 18 is transferred to the load-lock chamber 32 by the index robot 144. The atmosphere in the load-lock chamber 32 is switched to a vacuum atmosphere, and the first substrate $W_1$ is transferred to a first process unit by the transfer robot 250 and subjected to a first process. When the first process is completed, the first substrate $W_1$ is transferred to the unload-lock chamber 34 by the transfer robot 250. The atmosphere in the unload-lock chamber 34 is switched to the atmospheric atmosphere, and the index robot 144 transfers the first substrate $W_1$ to the buffer unit 2000.

Figure 8:
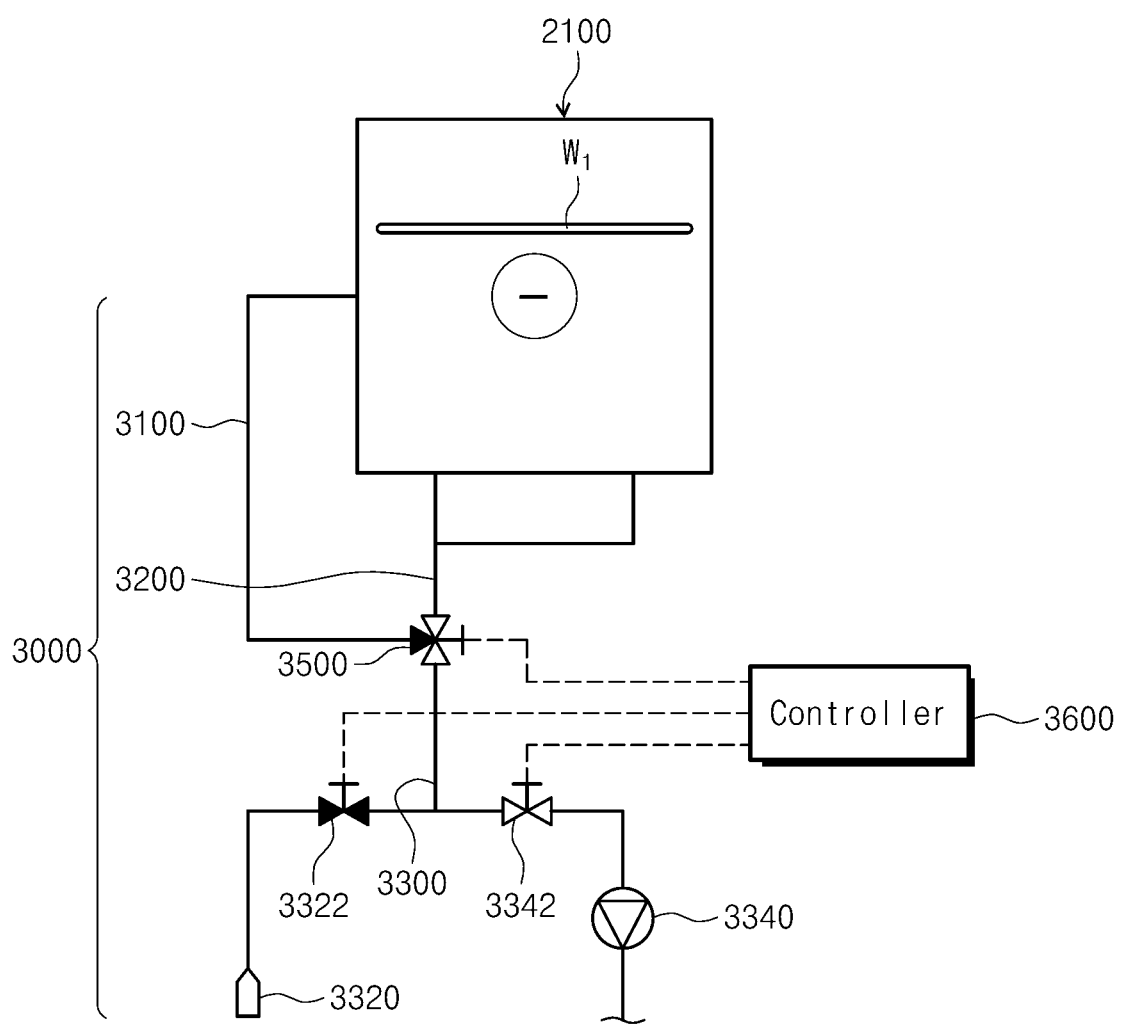
FIG. 8 is a view illustrating a process of performing an exhaust mode using the pressure adjustment unit of FIG. 7.

The first substrate $W_1$ is placed on the support slot 2330, and the pressure in the buffer space 2120 is reduced by the negative pressure delivered from the pressure-reducing member 3340. Due to this, the buffer space 2120 is maintained in an exhaust mode as illustrated in FIG. 8, and process by-products remaining on the first substrate $W_1$ are discharged and removed through the exhaust port 2400. For example, the gas used in the first process may include fluorine (F), chlorine (CO, or bromine (Br).

Figure 9:
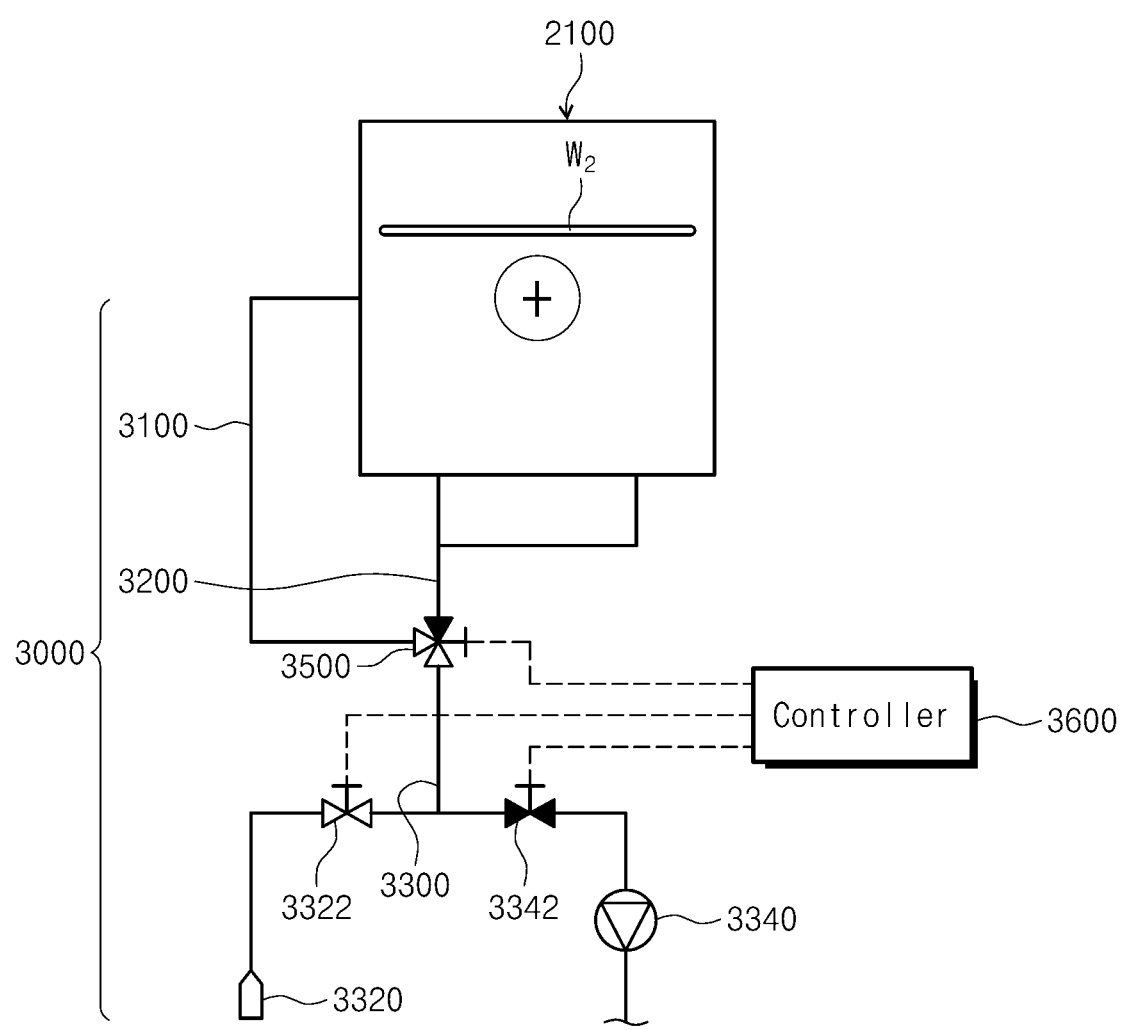
FIG. 9 is a view illustrating a process of performing a filling mode using the pressure adjustment unit of FIG. 7.

A second substrate $W_2$ different from the first substrate $W_1$ is subjected to a second process in a second process unit. The second substrate $W_2$ on which the second process is completely performed is transferred to the buffer unit 2000 and placed on the support slot 2330. The buffer space 2120 is pressurized by the gas dispensed from the gas nozzles 2600. Due to this, the buffer space 2120 is maintained in a filling mode as illustrated in FIG. 9, and process by-products remaining on the second substrate $W_2$ are purged and removed. For example, the gas used in the second process may include ammonia ($NH_3$).

In the above-described embodiments, it has been described that the first substrate $W_1$ and the second substrate $W_2$ are subjected to the different processes. However, one substrate may be selectively subjected to one of the first process and the second process, and the buffer space 2120 may be maintained in a selected one of the filling mode and the exhaust mode according to the type of gas used in the selected process.

According to the above-described embodiments, the status mode of the buffer space 2120 is varied depending on the type of gas used to treat the substrate. Accordingly, the status mode of the buffer space 2120 may be varied depending on the type of process by-products remaining on the substrate, and thus the cleaning efficiency may be improved.

Furthermore, according to the above-described embodiments, one of the gas supply line 3100 and the gas exhaust line 3200 is selected by the three-way valve 3500 and connected to the main line 3300. Due to this, the supply or release of gas may be performed without installation of two or more independent lines for the gas supply line 3100 and the gas exhaust line 3200, and the space efficiency for installing the gas supply line 3100 and the gas exhaust line 3200 may be improved.

According to the embodiments of the inventive concept, the gas supply line and the gas exhaust line are connected to the main line by the three-way valve. Accordingly, the inner space of the buffer unit may be maintained in a selected one of the filling mode and the exhaust mode.

Furthermore, according to the embodiments of the inventive concept, the gas supply line and the gas exhaust line are connected to the main line. Accordingly, the supply and release of gas may be performed without installation of two or more independent lines for the gas supply line and the gas exhaust line, and the space efficiency of the gas supply line and the gas exhaust line may be improved.

In addition, according to the embodiments of the inventive concept, the filling mode and the exhaust mode may be differently selected depending on the type of gas used to treat the substrate. Accordingly, the cleaning efficiency of the substrate may be improved.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A buffer unit for storing a substrate, the buffer unit comprising:
a housing having a buffer space inside;
a substrate support unit configured to support one or more substrates in the buffer space;
a pressure adjustment unit configured to adjust pressure in the buffer space; and
a controller configured to control the pressure adjustment unit,
wherein the pressure adjustment unit includes:
a gas supply line configured to supply a gas for pressurizing the buffer space; and
a gas exhaust line configured to reduce the pressure in the buffer space, and
wherein the controller controls the pressure adjustment unit to maintain the buffer space in a selected one of a filling mode in which the buffer space is filled with the gas and an exhaust mode in which the buffer space is evacuated;
wherein the controller controls the pressure adjustment unit to maintain the buffer space in a selected one of the filling mode and the exhaust mode according to a type of gas that is used to treat the substrates before the substrates are stored in the buffer space.

2. The buffer unit of claim 1, wherein the controller controls the pressure adjustment unit to maintain the buffer space in the exhaust mode when the gas includes fluorine (F), chlorine (Cl), or bromine (Br) and to maintain the buffer space in the filling mode when the gas includes ammonia ($NH_3$).

3. A buffer unit for storing a substrate, the buffer unit comprising:
a housing having a buffer space inside;
a substrate support unit configured to support one or more substrates in the buffer space;
a pressure adjustment unit configured to adjust pressure in the buffer space; and
a controller configured to control the pressure adjustment unit,
wherein the pressure adjustment unit includes:
a gas supply line configured to supply a gas for pressurizing the buffer space; and
a gas exhaust line configured to reduce the pressure in the buffer space, and
wherein the controller controls the pressure adjustment unit to maintain the buffer space in a selected one of a filling mode in which the buffer space is filled with the gas and an exhaust mode in which the buffer space is evacuated,
wherein the pressure adjustment unit further includes:
a main line;
a gas supply unit configured to supply the gas into the main line; and
a pressure-reducing member configured to reduce pressure in the main line, and
wherein the gas supply line and the gas exhaust line are connected with the main line through a three-way valve.

4. The buffer unit of claim 3, wherein the controller controls the three-way valve to open the gas supply line and block the gas exhaust line in the filling mode and to block the gas supply line and open the gas exhaust line in the exhaust mode.

5. An apparatus for treating a substrate, the apparatus comprising:
a process module configured to treat the substrate; and
an index module located on one side of the process module,
wherein the index module includes:
a load port on which a carrier having the substrate received therein is placed;
a transfer frame disposed between the load port and the process module; and
a buffer unit disposed on one side of the transfer frame and configured to temporarily store the substrate treated in the process module,
wherein the buffer unit includes:
a housing having a buffer space inside;
a substrate support unit configured to support one or more substrates in the buffer space;
a pressure adjustment unit configured to adjust pressure in the buffer space; and
a controller configured to control the pressure adjustment unit,
wherein the pressure adjustment unit includes:
a gas supply line configured to supply a gas for pressurizing the buffer space; and
a gas exhaust line configured to reduce the pressure in the buffer space, and
wherein the controller controls the pressure adjustment unit to maintain the buffer space in a selected one of a filling mode in which the buffer space is filled with the gas and an exhaust mode in which the buffer space is evacuated;
wherein the controller controls the pressure adjustment unit to maintain the buffer space in a selected one of the filling mode and the exhaust mode according to a type of gas that is used to treat the substrates before the substrates are stored in the buffer space.

6. The apparatus of claim 5, wherein the process module includes:
a first process unit configured to perform a first process; and
a second process unit configured to perform a second process independently of the first process unit,
wherein the controller maintains the buffer space in the exhaust mode for a substrate on which the first process is performed and maintains the buffer space in the filling mode for a substrate on which the second process is performed, and
wherein a gas used in the first process includes fluorine (F), chlorine (Cl), or bromine (Br), and a gas used in the second process includes ammonia (NH3).

7. The apparatus of claim 5, wherein the pressure adjustment unit further includes:
a main line;
a gas supply unit configured to supply the gas into the main line; and a pressure-reducing member configured to reduce pressure in the main line, wherein the gas supply line and the gas exhaust line are connected with the main line through a three-way valve, and wherein the controller controls the three-way valve to open the gas supply line and block the gas exhaust line in the filling mode and to block the gas supply line and open the gas exhaust line in the exhaust mode.

\* \* \* \* \*